United States Patent [19]

Terakado et al.

[11] Patent Number: 4,698,821

[45] Date of Patent: Oct. 6, 1987

[54] INTEGRATED LIGHT EMITTING/RECEIVING AMPLIFIER ELEMENT

[75] Inventors: Tomoji Terakado; Yuichi Odagiri, both of Tokyo, Japan

[73] Assignee: NEC Corporation, Tokyo, Japan

[21] Appl. No.: 733,683

[22] Filed: May 14, 1985

[30] Foreign Application Priority Data

May 17, 1984 [JP] Japan .................................. 59-99122

[51] Int. Cl.$^4$ ............................................... H01S 3/19
[52] U.S. Cl. ...................................... 372/50; 357/19; 357/40
[58] Field of Search ....................... 372/50; 357/19, 40

[56] References Cited

U.S. PATENT DOCUMENTS 4,349,906  9/1982  Seifres et al. .......................... 372/50

FOREIGN PATENT DOCUMENTS 0169981  10/1983  Japan ..................................... 357/19

OTHER PUBLICATIONS

Katz et al., "A monolithic Integration of GaAs/-GaAlAs Bipolar Transistor and Heterostructure Laser", Appl. Phys. Lett., 37(2), 15 Jul. 1980, pp. 211-213.

Primary Examiner—James W. Davie
Assistant Examiner—Georgia Y. Epps
Attorney, Agent, or Firm—Sughrue, Mion, Zinn, Macpeak and Seas

[57] ABSTRACT

An integrated light amplifier in which a stripe laser is formed over a substrate and then a vertical phototransistor is formed over the laser. Electrodes are attached to the back of the substrate and to the top of the phototransistor with the phototransistor electrode being formed with a hole so that incident light can reach the phototransistor. Before formation of the substrate electrode, the substrate can be ground to the desired thickness. Photocarriers are detected and multiplied in the phototransistor and injected into the stripe laser. Additional electrodes may be provided over the laser in order to bias the laser independently of the incident light.

3 Claims, 5 Drawing Figures

INTEGRATED LIGHT EMITTING/RECEIVING AMPLIFIER ELEMENT

BACKGROUND OF THE INVENTION

The present invention relates to an integrated light emitting/receiving amplifier element, which is a principal constituent element for optical communication, optical exchange and optical data processing systems.

One of the basic circuits used for optical communication, optical exchange and optical data processing is a light amplifier circuit. Basic study is under way on this kind of circuit, which is expected to permit simpler structure than other conventional electronic circuits. Light amplifier circuits can be classified into combinations of a light receiving element and a semiconductor laser and others whose principal constituent element is a semiconductor laser. A light amplifier circuit of the first category, which is relatively easier to package and assemble and in itself less dependent on temperature can be even more simply structured by integrating the elements.

An example of the integration of a light receiving element and a semiconductor laser is proposed by H. Beneking et al. in "GaAs-GaAlAs Phototransistor/-Laser Light Amplifier" published in ELECTRONICS LETTERS, Vol. 16, No. 15, 1980, pp. 602–603. This report proposes, as a method to integrate the two kinds of element, to grow a semiconductor laser on one end face and a phototransistor on the other of a semiconductor substrate. An optical signal incident upon a light receiving face formed on the emitter side of the phototransistor is converted to a photo-current which is amplified in the phototransistor region and is supplied to the semiconductor laser through the common semiconductor substrate. Since about 2,000 negative electrons (or positive holes) are generated per photon in a usual phototransistor, even very weak optical signals can be regenerated and amplified. However, the structure wherein the semiconductor substrate is sandwiched between the semiconductor laser and the phototransistor requires the division of crystalline growth into at least two phases. Therefore, in this fabricating process, grinding of the wafer into the desired wafer thickness is carried out before the second phase of crystalline growth, and the light receiving face, electrodes and so forth are formed after the crystalline growth. As a consequence, there arises the problem of a thinned wafer thickness and fabricating-difficulty. Accordingly there has been a call for a light amplifier element whose structure permits ready crystalline growth and integration by a usual process.

SUMMARY OF THE INVENTION

An object of the present invention, therefore, is to provide an integrated light emitting/receiving amplifier element which permits ready crystalline growth and requires only a simple manufacturing process.

The integrated light emitting/receiving amplifier element of the present invention comprises a phototransistor over a semiconductor layer at the top of a semiconductor laser of a multilayered structure formed over a semiconductor substrate.

According to more specific feature of the invention, the integrated light emitting/receiving element comprises: a semiconductor substrate of a first conductivity type; a semiconductor laser, formed over the semiconductor substrate, comprising a first semiconductor layer of the first conductivity type, a second semiconductor layer emitting light upon injection of an electric current, and a third semiconductor layer of a second conductivity type opposite to the first conductivity type; a phototransistor comprising a collector layer of the second conductivity type, a base layer of the first conductivity type and an emitter layer of the second conductivity type, successively formed over the semiconductor laser; a first electrode formed over the bottom of the semiconductor substrate; and a second electrode formed over the emitter, leaving an opening through which to let incident light in, the light emitting/receiving element amplifying light by injecting into the semiconductor laser a multiplied photocurrent generated by the phototransistor in response to incident light coming in through the opening.

Since this structure requires only the formation of a semiconductor laser and a phototransistor over a semiconductor substrate, crystalline growth can be achieved by the conventional method, needing no more than one stage of crystalline growth unless the semiconductor laser is buried or two stages even if it is buried. The manufacturing procedure is simple because what is needed is, after electrode formation on one face following crystalline growth, merely to grind the other face to a desired thickness.

BRIEF DESCRIPTION OF THE DRAWINGS

FIG. 2A is an energy diagram illustrating the state of the first preferred embodiment under bias when no light is coming in;

DESCRIPTION OF THE PREFERRED EMBODIMENTS

Figure 1:
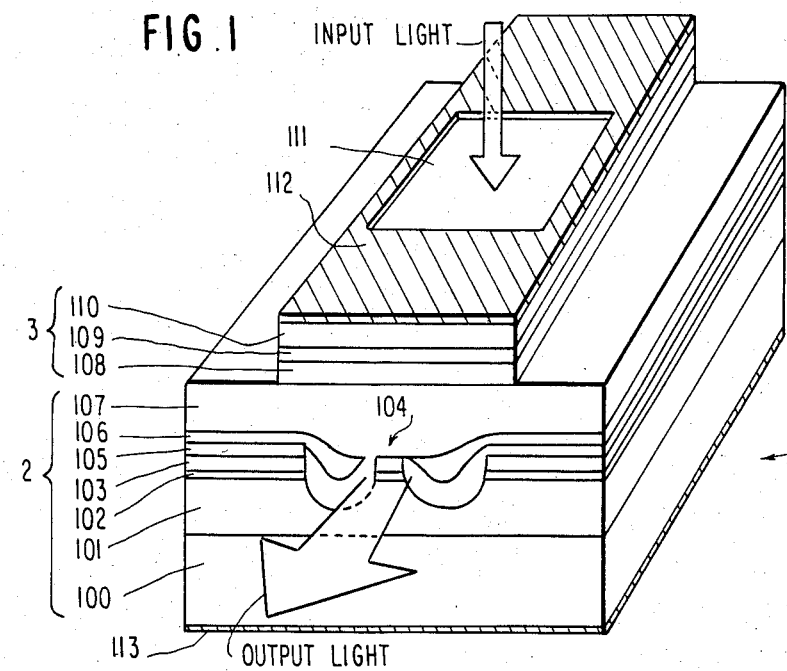
FIG. 1 shows an oblique view of a first preferred embodiment of the present invention.

Referring to FIG. 1, an integrated light emitting-/receiving amplifier element 1 according to the present invention involves a semiconductor laser 2 and a phototransistor 3. The semiconductor laser 2 further involves semiconductor layers 101 through 107, and the phototransistor 3 involves semiconductor layers 108 through 110.

To manufacture this element 1, over a p-type (hereinafter abbreviated to p-) InP substrate 100, there are successively grown a p-InP clad layer 101, a non-doped InGaAsP (1.3 microns in bandgap wavelength) active layer 102 and an n-InP clad layer 103 to form a double hetero substrate. This structure is formed into a mesa 104, positioned between two grooves, by applying photoresist and using conventional photolithographic and etching techniques. Next, over this wafer are grown, by the liquid phase growth method, an n-InP first current blocking layer 105, a p-InP second current blocking layer 106, an n-InP burying layer 107, an n-InGaAs (1.6 microns in bandgap wavelength, $10^{15}$ cm$^{-3}$ in impurity concentration) collector layer 108, a p-InGaAs (1.6 microns in bandgap wavelength, $10^{18}$ cm$^{-3}$ in impurity concentration) base layer 109 and an n-InP ($10^{17}$ cm$^{-3}$ in impurity concentration) emitter layer 110 to complete crystalline growth. After forming an AuGeNi vaporized film 112 over the n-InP emitter layer 110, the central part of the vaporized film is etched with $KI+I_2$ solution by the usual photolithographic technique to expose the emitter layer through which light is to be injected into the phototransistor 3 and thereby to form a light receiving face 111. Then, in order to reduce the junction capacity of the phototransistor 3, the vaporized film 112, the n-InP emitter layer 110, the p-InGaAs base layer 109 and the n-InGaAs collector layer 108 are successively so etched by the conventional photolithographic and etching techniques with $KI+I_2$ solution, $HCl-H_2O$ mixture, $H_2SO_4-H_2O_2-H_2O$ mixture, and $H_2SO_4-H_2O_2-H_2O$ mixture, respectively, that each of these layers form a 30-micron wide stripe over the mesa 104. The part of the film 112 surviving this etching process constitutes a first n-electrode 112. Then the bottom of the p-InP substrate 100 is ground to a desired thickness, usually 100 to 150 microns, to form a p-electrode 113. After that, both ends of the mesa 104 are cleaved to form a resonator.

Typical dimentions of this preferred embodiment are 1.5 microns for the width of the mesa 104, 300 microns for the resonator length, 3 microns for the thickness of the collector layer 108, 0.5 micron for that of the base layer 109, 3 microns for that of the emitter layer 110, and 20 microns $\times$ 30 microns for the area of the light receiving face 111.

By so applying a bias voltage to this integrated element 1 as to make the p-electrode 113 positive and the n-electrode 112 negative, having the light receiving face of the phototransistor 3 receive incident light and using a photocurrent multiplied by the phototransistor as injection current to the semiconductor laser, a laser output is provided from an end face of the mesa 104.

Figure 2A:
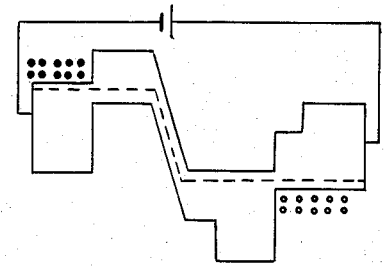
Figure 2B:
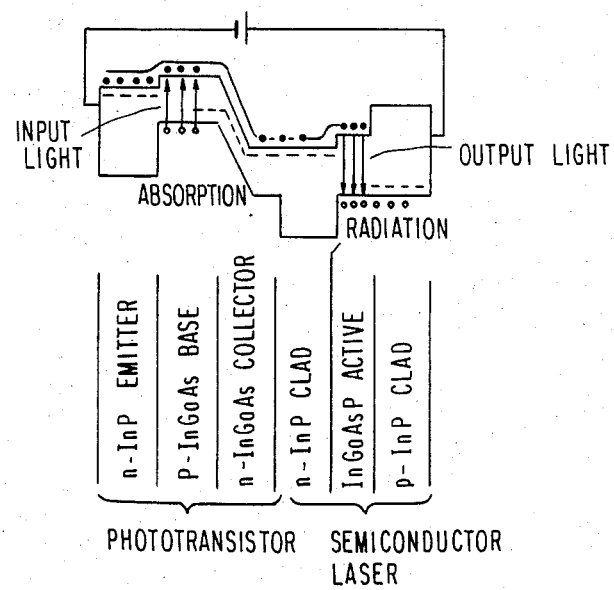
FIG. 2B is another energy diagram illustrating the state of same when light is coming in, referring to light absorption, photocurrent and light emitting process at the same time.

FIG. 2A is an energy diagram illustrating the state of this preferred embodiment when a bias voltage is applied in the absence of optical input, while FIG. 2B is another energy diagram illustrating the state of the embodiment in the presence of an optical input, referring to light absorption, photocurrent and light emitting process at the same time.

In the absence of optical input, as shown in FIG. 2A, electrons in the n-emitter are prevented by the p-base barrier from flowing toward the n-collector. In the presence of incident light, as shown in FIG. 2B, the optical input is absorbed within the p-base, made of a material having a narrow bandgap for the wavelength of the incident light, resulting in the formation of electron-hole pairs. The positive holes so formed remain in the base to lower the emitter-base barrier against electrons, so that the electrons in the emitter massively flow toward the collector and are supplied to the semiconductor laser. In the active layer of the semiconductor laser, these electrons rejoin the positive holes supplied from the p-electrode formed on the p-type semiconductor substrate side, and generate light. Since this structure requires only the laying of a semiconductor laser and a phototransistor over a semiconductor substrate, crystalline growth can be achieved by the conventional method, needing no more than one stage of crystalline growth unless the semiconductor laser is buried or two stages even if it is buried. The manufacturing procedure is simple because what is needed is, after electrode formation on one or top face following crystalline growth, merely to grind the other or bottom face to a desired thickness.

Figure 3:
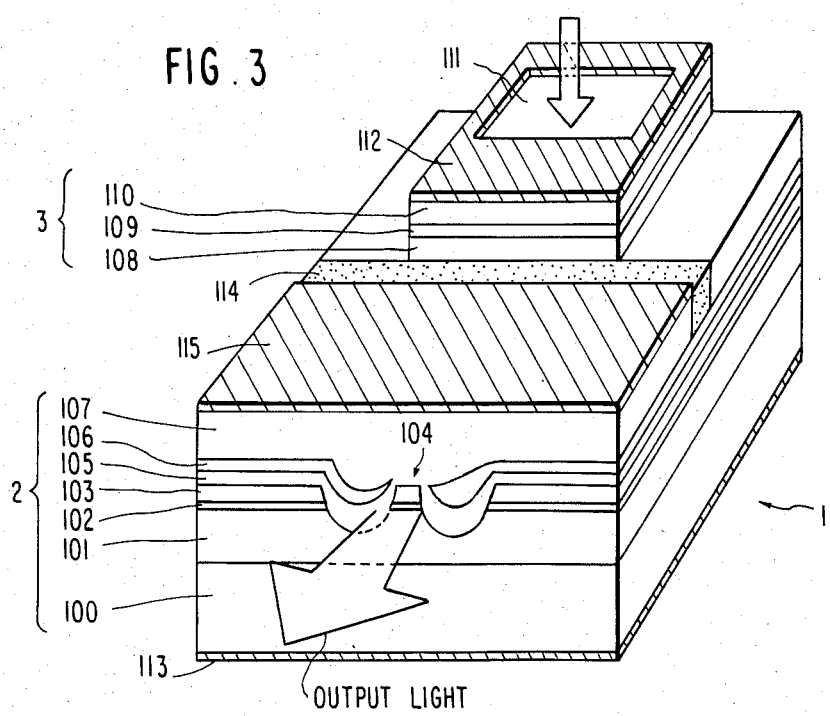
FIGS. 3 and 4 show oblique views of second and third preferred embodiments, respectively, of the present invention.

FIG. 3 shows an oblique view of a second preferred embodiment of the present invention, wherein an electrode 115 for injecting electrons into a semiconductor laser 2 is newly formed in the axial direction of a resonator to reduce the load on its phototransistor. Thus the phototransistor 3 is formed over approximately half the length of a mesa stripe 104 and extends from an end face of the semiconductor laser 2. The an n-InP layer 107 is subjected to Zn diffusion in a direction normal to that of the mesa stripe approximately in the middle of the mesa stripe and is converted into p-type thus forming an electric separation layer (10 microns wide) 114 that reaches the second current blocking layer 106. A second n-electrode 115 is formed over the n-InP buried layer 107. The bottom of a substrate 100 includes the p-electrode 113.

If, in this structure, a bias current in a forward direction is applied between the second n-electrode 115 and the p-electrode 113 in the vicinity of the threshold of laser oscillation, the whole photocurrent from the phototransistor 3 can be effectively utilized for laser oscillation.

Figure 4:
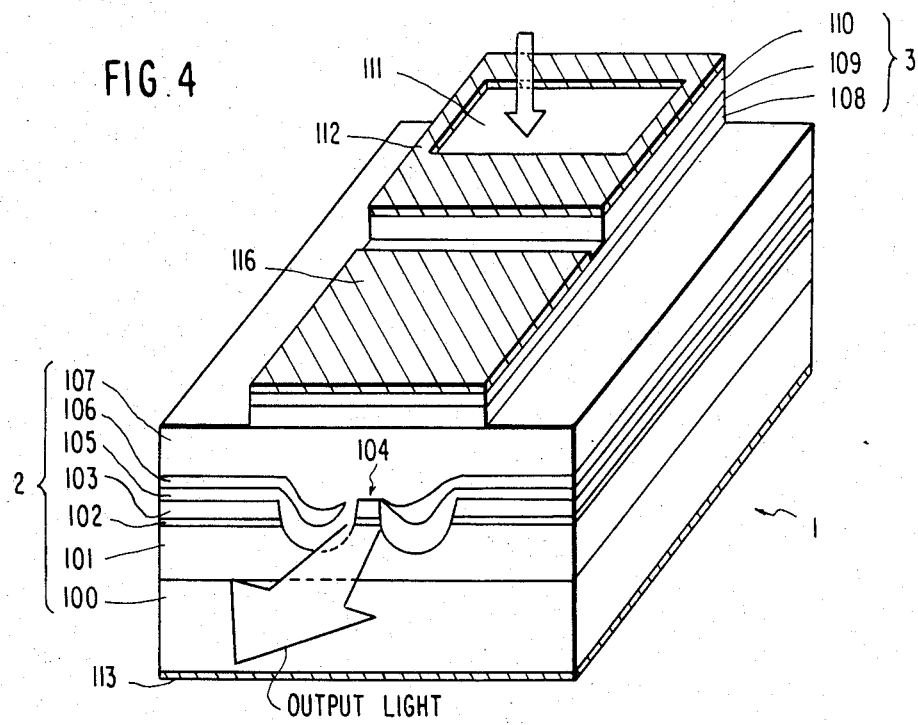

FIG. 4 shows an oblique view of a third preferred embodiment of the present invention, wherein another electrode 116 is formed on the base layer 109 to control the current flowing through a phototransistor 3 with not only optical signals but with the current of the base layer 109. Crystalline growth and the formation of an n-electrode 112 and a light receiving face 111 of the phototransistor 3 are achieved in respectively the same manner as in the first preferred embodiment. This embodiment involves the phototransistor 3, whose light receiving face 111 and electrode 112 are formed on one lateral side of the mid-point of the mesa of a multi-layered structure comprises a collector layer 108, a base layer 109 and further comprises the emitter layer 110, and an AuZn base electrode 116 formed over the base layer 109 on the other lateral side of the mid-point of the mesa, where the emitter layer 110 has been removed. In this structure, since the base electrode 116 enables a base current to flow as well, it is possible to control the current flowing through the phototransistor 3 with not only optical signals but also with the base current.

The embodiments of the present invention can have many different versions. The dimensions of the light receiving face 111 of the phototransistor 3 are not particularly limited. Nor are the shape, dimensions and material of the n-electrode 112. Also acceptable is a combination of the second and third preferred embodiments, which has both a second n-electrode 115 for injecting electrons into the semiconductor laser 2 and a base electrode 116 for controlling the current in the phototransistor 3. The stripe of the semiconductor laser need not be buried, but can be structured in many other ways, for instance in a planar stripe form. In the foregoing embodiments, the n-type and p-type can be reversed. Although InP/InGaAsP-based semiconductor materials are used in these embodiments, other semiconductor materials, including GaAlAs/GaAs-based ones, can also be used.

What is claimed is:

1. An integrated light emitting/receiving element comprising:
   a semiconductor substrate of a first conductivity type;
   a semiconductor laser, formed on said semiconductor substrate, comprising a first semiconductor layer of said first conductivity type, a second semiconductor layer emitting light upon injection of an electric current, and a third semiconductor layer of a second conductivity type opposite to said first conductivity type;

a phototransistor comprising a collector layer of said second conductivity type, a base layer of said first conductivity type and an emitter layer of said second conductivity type, successively formed on said third semiconductor layer of said semiconductor laser, said phototransistor being formed on a first portion of said laser;

a first electrode formed on a side of said semiconductor substrate opposite said first semiconductor layer;

a second electrode formed on said emitter layer, leaving an opening through which to let incident light in, said light emitting/receiving element amplifying light by injecting into said semiconductor layer a multiplied photocurrent generated by said phototransistor in response to incident light coming in through said opening; and a third electrode formed on said third semiconductor layer in a portion of said laser other than said first portion, said laser being biased substantially at the threshold level of laser oscillation through said third electrode.

2. An integrated light emitting/receiving element as recited in claim 1, further comprising an electric separation layer of a semiconductor material of said second conductivity type extending between said third electrode and said phototransistor and contacting said third semiconductor layer.

3. An integrated light emitting/receiving element as recited in claim 2, wherein said first, second and third semiconductor layers are formed in a mesa structure, and further comprising at least one current blocking layer formed to a side of said mesa structure and extending perpendicular to a direction of formation of the layers of said laser.

* * * * *

UNITED STATES PATENT AND TRADEMARK OFFICE
CERTIFICATE OF CORRECTION

PATENT NO. : 4,698,821

DATED : October 6, 1987

INVENTOR(S) : Tomoji Terakado et al

It is certified that error appears in the above-identified patent and that said Letters Patent is hereby corrected as shown below:

COLUMN 3, LINE 22   Delete "dimentions" insert --dimensions--

Signed and Sealed this

Second Day of August, 1988

Attest:

DONALD J. QUIGG

*Attesting Officer*    *Commissioner of Patents and Trademarks*